US010692972B2

(12) United States Patent
Brown et al.

(10) Patent No.: US 10,692,972 B2
(45) Date of Patent: Jun. 23, 2020

(54) SEMICONDUCTOR DEVICE AND METHOD OF OPERATION FOR LOW AND HIGH THRESHOLD VOLTAGE TRANSISTORS

(71) Applicant: NEXPERIA B.V., Nijmegen (NL)

(72) Inventors: Adam Richard Brown, Stockport (GB); Jim Brett Parkin, Stockport (GB); Phil Rutter, Stockport (GB); Steven Waterhouse, Stockport (GB); Saurabh Pandey, Stockport (GB)

(73) Assignee: Nexperia B.V., Nijmegen (NL)

( * ) Notice: Subject to any disclaimer, the term of this patent is extended or adjusted under 35 U.S.C. 154(b) by 120 days.

(21) Appl. No.: 16/162,631

(22) Filed: Oct. 17, 2018

(65) Prior Publication Data

US 2019/0123139 A1 Apr. 25, 2019
US 2020/0066840 A9 Feb. 27, 2020

(51) Int. Cl.
*H01L 29/06* (2006.01)
*H01L 29/78* (2006.01)
(Continued)

(52) U.S. Cl.
CPC ...... *H01L 29/0696* (2013.01); *H01L 27/0727* (2013.01); *H01L 29/4236* (2013.01);
(Continued)

(58) Field of Classification Search
CPC ............. H01L 29/0696; H01L 29/4236; H01L 27/0727; H01L 29/42376; H01L 29/7813; H03K 17/6874; H03K 17/08104; H03K 17/164; H03K 17/302; H03K 17/687; H03K 2017/0806
See application file for complete search history.

(56) References Cited

U.S. PATENT DOCUMENTS 7,504,690 B2 * 3/2009 Kelly .................. H01L 29/407
257/328
9,966,870 B2 * 5/2018 Kondo ................. H02M 5/458
(Continued)

OTHER PUBLICATIONS

European search report for corresponding application EP17199452, 2 pages, dated May 3, 2018.
(Continued)

*Primary Examiner* — John P. Dulka
(74) *Attorney, Agent, or Firm* — Ohlandt, Greeley, Ruggiero & Perle, L.L.P.

(57) ABSTRACT

A field effect transistor semiconductor device having a compact device footprint for use in automotive and hot swap applications. The device includes a plurality of field effect transistor cells with the plurality of transistor cells having at least one low threshold voltage transistor cell and at least one high threshold voltage transistor cell arranged on a substrate. The field effect transistor semiconductor device is configured and arranged to operate the at least one high threshold voltage transistor cell during linear mode operation, and operate both the low threshold voltage transistor cell and the high threshold voltage transistor cell during resistive mode operation. Further provided is a method of operating field effect transistor semiconductor device including a plurality of field effect transistor cells that includes at least one low threshold voltage transistor cell and at least one high threshold voltage transistor cell.

12 Claims, 8 Drawing Sheets

(51) Int. Cl.
    *H03K 17/687*     (2006.01)
    *H01L 29/423*     (2006.01)
    *H01L 27/07*     (2006.01)
    *H03K 17/30*     (2006.01)
    *H03K 17/16*     (2006.01)
    *H03K 17/081*     (2006.01)
    *H03K 17/08*     (2006.01)

(52) U.S. Cl.
    CPC .... *H01L 29/42376* (2013.01); *H01L 29/7813* (2013.01); *H03K 17/08104* (2013.01); *H03K 17/164* (2013.01); *H03K 17/302* (2013.01); *H03K 17/687* (2013.01); *H03K 17/6874* (2013.01); *H03K 2017/0806* (2013.01)

(56) References Cited

U.S. PATENT DOCUMENTS

2009/0212846 A1*   8/2009   Cutter ................ H01L 29/7802
                                                           327/434
2017/0309619 A1*  10/2017  Bina ................... H01L 27/0207

OTHER PUBLICATIONS

European search opinion for corresponding application EP17199452, 6 pages, dated May 3, 2018.

\* cited by examiner

SEMICONDUCTOR DEVICE AND METHOD OF OPERATION FOR LOW AND HIGH THRESHOLD VOLTAGE TRANSISTORS

CROSS REFERENCE TO RELATED APPLICATION

The present application claims foreign priority to European Patent Application No. 17199452.8 filed on Oct. 23, 2017 the entirety of which is incorporated by reference hereby.

BACKGROUND

The present disclosure relates to a semiconductor device and a method of operation. More specifically, the disclosure relates to a transistor comprising transistor cells with different threshold voltages.

Power metal oxide semiconductor field effect transistors (MOSFETs) are typically used as electronically controlled power switches. Depending on the application, for example in linear regulators or electronic loads, these power MOSFETs are operated in the linear region (i.e. linear mode). When operating in the linear region, power MOSFET devices experience high thermal stress during switching instances, where the drain current and drain-source voltage are simultaneously high resulting in high power being dissipated by the devices.

Modern power MOSFET devices with small cell pitches (<10 μm), that is the distance between adjacent transistor cells on the device, are susceptible to thermal runaway when operated in the linear region. Small cell pitch power MOSFETs are characterised by a critical current density $J_C$ above which an operating current density in the device decreases with increasing temperature, but below which the operating current density in the device increases with increasing temperature. If a power MOSFET is operated below the critical current density $J_C$, a small increase in temperature increases the operating current density. This effect causes an increase in device temperature, which in turn causes still higher current density, eventually leading to thermal runaway.

The critical current density $J_C$ of a device is governed by two competing effects. Firstly, in operation, the channel resistance of the MOSFET device increases due to heating in the device which may lead to a reduction in the current density. Secondly, the threshold voltage of the power MOSFET may reduce with increasing temperature. When operating in the linear region, the decreased threshold voltage in the device alters the effective gate voltage, thereby increasing the operating current density of the device with increasing temperature. As the gain increases, the second effect becomes more important. Modern power MOSFETS with small cell pitches have high values of gate width per unit area and are operated at currents such that the second effect is dominant, that is, the MOSFETs are operated below the critical current density $J_C$. The consequence of this is that these MOSFETs are more prone to thermal runaway which can lead to device failure.

There is accordingly a need for a MOSFET in which one or more of the problems are alleviated.

For example in automotive applications, FETs can be optimised for energy efficiency such that they have low on resistance ($R_{dson}$), but at the same time are able to withstand high voltage surges or transients caused by unexpected load dump scenarios. A load dump occurs when a connection to an automobile battery suddenly fails in a motor vehicle and the charging current provided by a vehicle generator continues to flow for a period of time. This current has to be absorbed or taken up by the automobile electronics until the vehicle alternator is turned off. Typically, in such applications, FETs are not operated in the linear region.

Such FETs consist of providing semiconductor regions, where each region has a channel width w and the channel length l, and the ratio of the channel width to length is larger for one region than the other. Each region is electrically linked to a gate terminal via different predetermined resistors.

Such devices are formed of intermeshed FETs in parallel distributed by two gate bus-bars and interconnected by a network of resistors and diodes. The diode circuitry is placed between the gate and drain of the FETs. Such a configuration may help improve energy handling during for example clamped inductive handling, particularly during load dump scenarios. Therefore these utilise intermeshed FETs with the same threshold voltage.

In some applications, FETs may also be optimised for reduced parasitic capacitance. For example, stripe trench FETs can be configured with a number of transistor cells having varying voltage thresholds. By dividing some of the cells into a plurality of regions with varying threshold voltages, when the transistor is first turned on, conduction will occur preferentially in regions of low threshold voltage. The current density in these regions will accordingly be higher, either above the critical current density $J_C$ or just below it, reducing risk of thermal runaway.

These cells are arranged as stripes to have varying threshold voltage regions distributed along at least some of the stripes in order to mitigate increased current density. By ensuring that lower threshold voltage regions are distributed along the same stripes as the higher threshold voltage regions, large areas of high current can be avoided thus reducing the risk of current crowding that can lead to thermal runaway in the device.

When used in switching applications, a voltage clamp circuit may be connected to these FETs to ensure that voltage spikes or transients on the voltage rails do not cause damage to the device during turn-off. A dual threshold voltage approach may be adopted, with a large number of high threshold voltage cells and a small number of low threshold voltage cells. In linear mode operation, the low threshold voltage cells are turned on in these devices. This allows the current density in these regions of the device to increase, either above the critical current density $J_c$ or less far below it.

SUMMARY

According to an embodiment, a field effect transistor semiconductor device comprises a device gate terminal, a device source terminal, a device drain terminal, a substrate, and a plurality of field effect transistor cells, each transistor cell comprising a gate terminal, a source terminal and a drain terminal, wherein the plurality of transistor cells comprise at least one low threshold voltage transistor cell and at least one high threshold voltage transistor cell arranged on the substrate, the gate of the at least one low threshold voltage transistor cell being connected to a first electrical conductor, and the gate of the at least one high threshold voltage transistor cell being connected to a second electrical conductor, and wherein the first and second conductors are electrically coupled to the device gate terminal and each of the drain terminals of the high and low threshold voltage transistor cells are connected in parallel to the device drain terminal. The field effect transistor semiconductor device is configured and arranged to operate the at least one high threshold voltage transistor cell during linear mode operation, and operate both the low threshold voltage transistor cell and the high threshold voltage transistor cell during resistive mode operation.

Advantageously, operating the field effect transistor semiconductor device in this manner allows the device to withstand high current density in the linear mode without risk of it suffering from thermal runaway.

According to another embodiment, is a method of operating a field effect transistor semiconductor device comprising a device gate terminal, a device source terminal, a device drain terminal, a substrate, and a plurality of field effect transistor cells, each transistor cell comprising a gate terminal, a source terminal and a drain terminal, wherein the plurality of transistor cells comprise at least one low threshold voltage transistor cell and at least one high threshold voltage transistor cell arranged on the substrate, the gate of the at least one low threshold voltage transistor cell being connected to a first electrical conductor, and the gate of the at least one high threshold voltage transistor cell being connected to a second electrical conductor, and wherein the first and second conductors are electrically coupled to the device gate terminal and each of the drain terminals of the high and low threshold voltage transistor cells are connected in parallel to the device drain terminal. The method comprises operating the at least one high threshold voltage transistor cell when operating the field effect transistor semiconductor device in linear mode, and operating both the low threshold voltage transistor cell and the high threshold voltage transistor cell when operating the field effect transistor semiconductor device in resistive mode.

BRIEF DESCRIPTION OF THE DRAWINGS

For a more complete understanding of the present disclosure, reference is now made to the following description taken in conjunction with the accompanying drawings in which.

DETAILED DESCRIPTION

Figure 1:
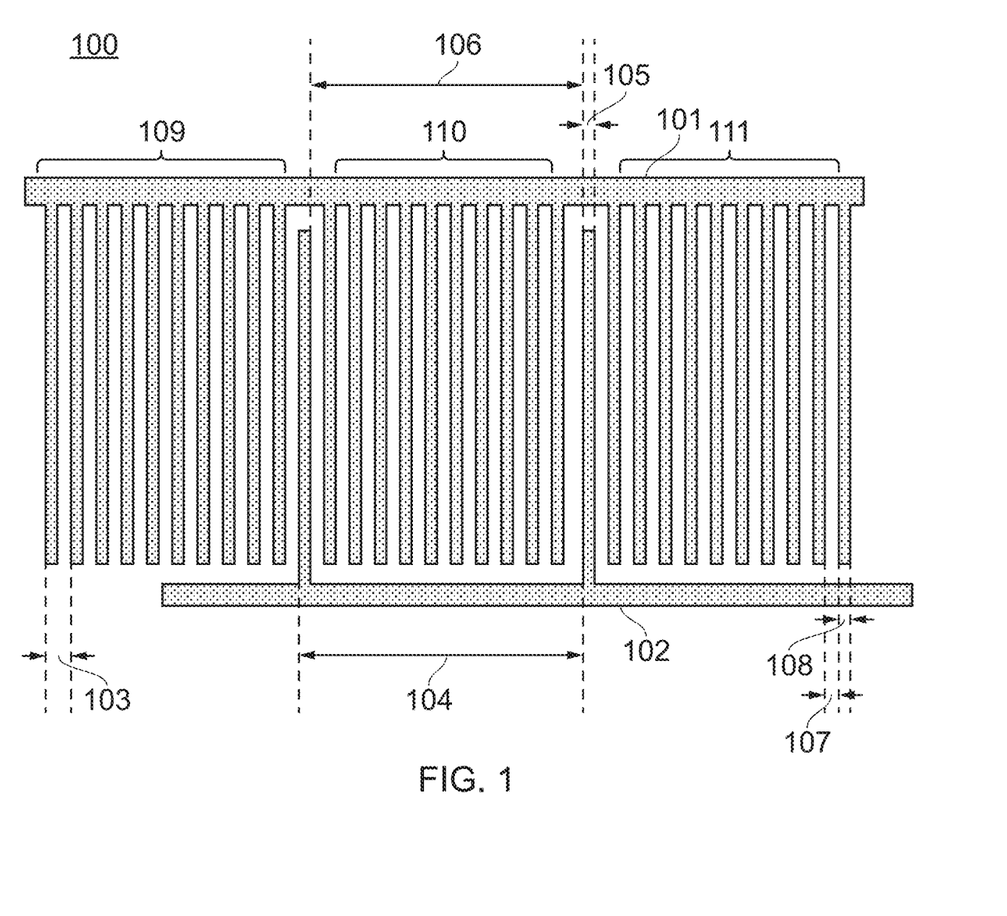
FIG. 1 illustrates a top view of an arrangement of an example stripe trench FET device.

In the semiconductor device according to embodiments a trench FET structure may comprise a plurality FET cells arranged as stripes as illustrated in FIG. 1. The plurality of cells are arranged on a semiconductor substrate (not illustrated), and may comprise a plurality of low threshold (Vt) voltage cells 103 and a plurality of high threshold (Vt) voltage cells 104.

The plurality of low threshold voltage Vt cells 103 may be arranged as uniform elongated stripes on a surface of a carrier or substrate (not illustrated), creating a plurality of regions of low Vt cells 109, 110, 111. Each low Vt cell 103 comprises a gate 108, source and drain (not illustrated) and a conduction region 107 immediately adjacent to the gate 108. The conduction region 107 terminates just before the next adjacent gate. The gate 108 of each low Vt cell 103 is electrically coupled to a common low Vt gate bus-bar 101.

The plurality of high threshold voltage Vt cell 104 may also be arranged as uniform elongated stripes on the surface of the carrier or substrate (not illustrated). Each high Vt cell 104 comprises a gate 105 and a conduction region 106 immediately adjacent to the gate 105, the conduction region 106 terminating just before the next adjacent gate 105 of the next high Vt cell 104. The gate 105 of each of the high Vt cell 104 may be electrically coupled to a common high Vt gate bus-bar 102.

The high Vt cells and low Vt cells are configured on the surface of the carrier or substrate such that at least one gate 105 of a high Vt cell 104 is located between two adjacent low Vt cell regions 109 and 110, in an interleaved manner as shown in FIG. 1. This sequence may be repeated as necessary over the surface of the carrier or substrate.

The stripe trench FET device is configured and arranged such that the low Vt cells 103 and high Vt cells 104 can be selectively turned on or off by applying a suitable voltage to one or both of the low and high Vt gate bus-bars 101, 102 respectively. The operation of the device will be discussed in more detail below.

To prevent thermal runaway when operated in linear mode (that is, when a high drain-source voltage $V_{ds}$ is applied across the drains and source terminal of the stripe trench FET device), a high current density in the low and high Vt cells 103, 104 that are turned on is desired. Typically, the MOSFET has a critical current density above which current decreases with increasing temperature, known as the Zero Temperature Coefficient ZTC. Operating the MOSFET above the ZTC point ensures thermal stability in the semiconductor device 200a without formation of hotspots. This is achieved with a semiconductor device having a larger ratio of low Vt cells 103 to high Vt cells 104. However, if this ratio is set too high, the quantity of active low and/or high Vt cells 103, 104 (that is, cells that are turned on) will be too small to withstand the current at a given gate bias. The gate bias will rise as a result and the inactive Vt cells will turn on, defeating the purpose of having regions of active and inactive cells.

According to embodiments, the semiconductor device 200a may comprise more low Vt cells 103 than high Vt cells 104. For example, in applications utilising 100V MOSFETs, the preferred ratio of low Vt cells 103 to high Vt cells 104 is typically 9:1, this is nine low Vt cells for every one high Vt cell. In an application for lower current densities, a higher ratio is acceptable.

In FIGS. 2(a) to 2(d), the plurality of low Vt cells 103 are schematically represented by FET 204. The gate of the FET 204, which represents all the gates 108 of the plurality of low Vt cells in parallel, connects to the common low Vt gate bus-bar 101 terminating at a node 211. The plurality of high Vt cells 104 are schematically represented by FET 205. The gate of the FET 205 represents all of the gates 105 of the high Vt cells 104, connects to the common high Vt gate bus-bar 102. The semiconductor devices 200a to 200d also comprise three output terminals, a gate terminal 201 connected to the low and high Vt gate bus-bars 101, 102, a drain terminal 206 connected to the drains of the low and high Vt cells and a source terminal 207 connected to the sources of the low and high Vt cells. According to embodiments, the gates 105 and 108 may comprise of a polysilicon material.

A gate control circuit 202 as shown in FIGS. 2(a) to 2(d) may be monolithically integrated into the stripe trench FET structure (not illustrated), for example, to the side or on top of the voltage Vt cells stripe structure as shown in FIG. 1.

Alternatively, the gate control circuit 202 may also be an external circuit, for example a separate silicon substrate, placed to the side or on top of the main stripe trench FET substrate and electrically coupled to it. The gate control circuit 202 controls the turn-on and turn-off of the stripe trench FETs 204 and 205, which in turn controls the turn-on and turn-off of the semiconductor devices 200a to 200d.

Figure 2A:
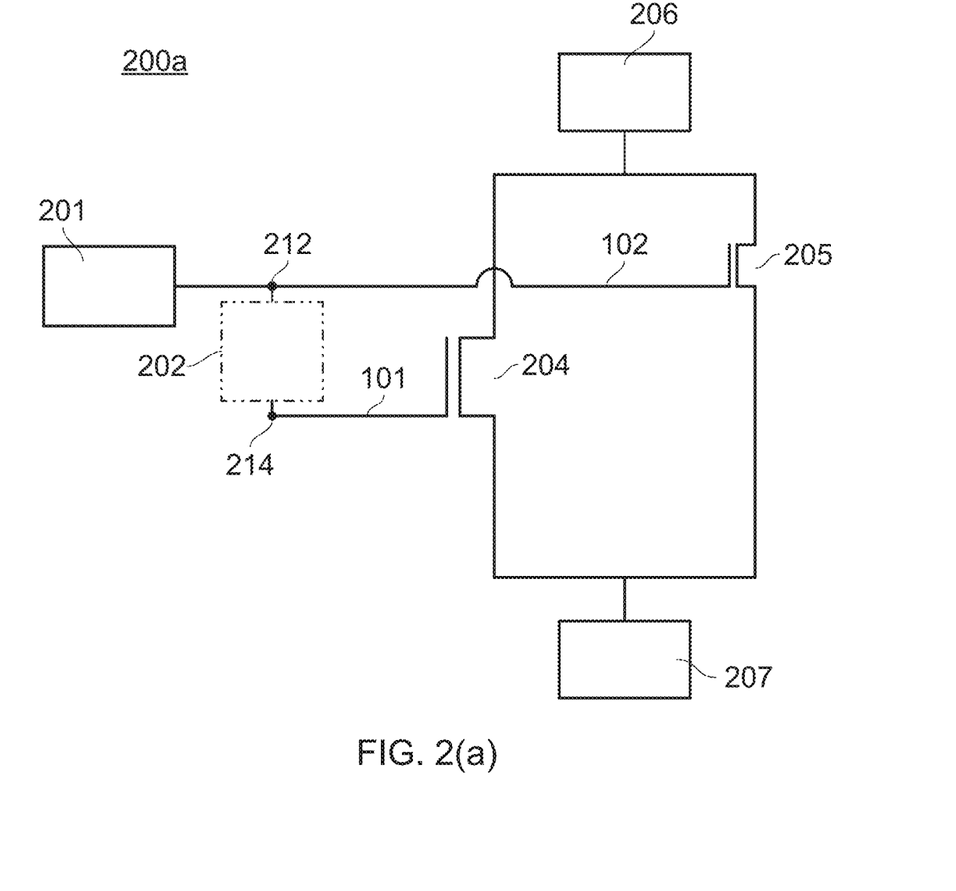
FIGS. 2(a) to 2(d) illustrate circuit representations of different stripe trench FET devices.
Figure 2B:
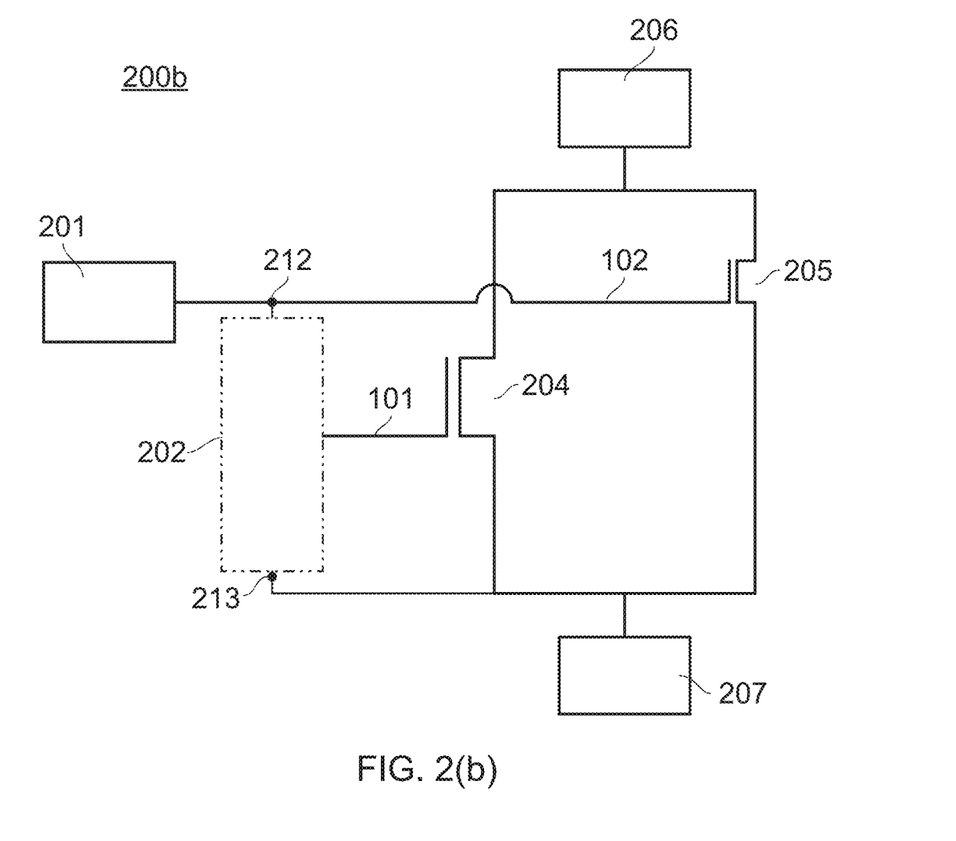

The gate control circuit 202 may be electrically coupled to the gate terminal 201 and the low Vt gate bus-bar 101. In an alternative configuration as shown in FIG. 2(b), the gate control circuit 202 may be electrically coupled to the gate terminal 201 and the source terminal 207. In this configuration, the low Vt gate bus-bar 101 is also electrically coupled to the gate control circuit 202.

Figure 2C:
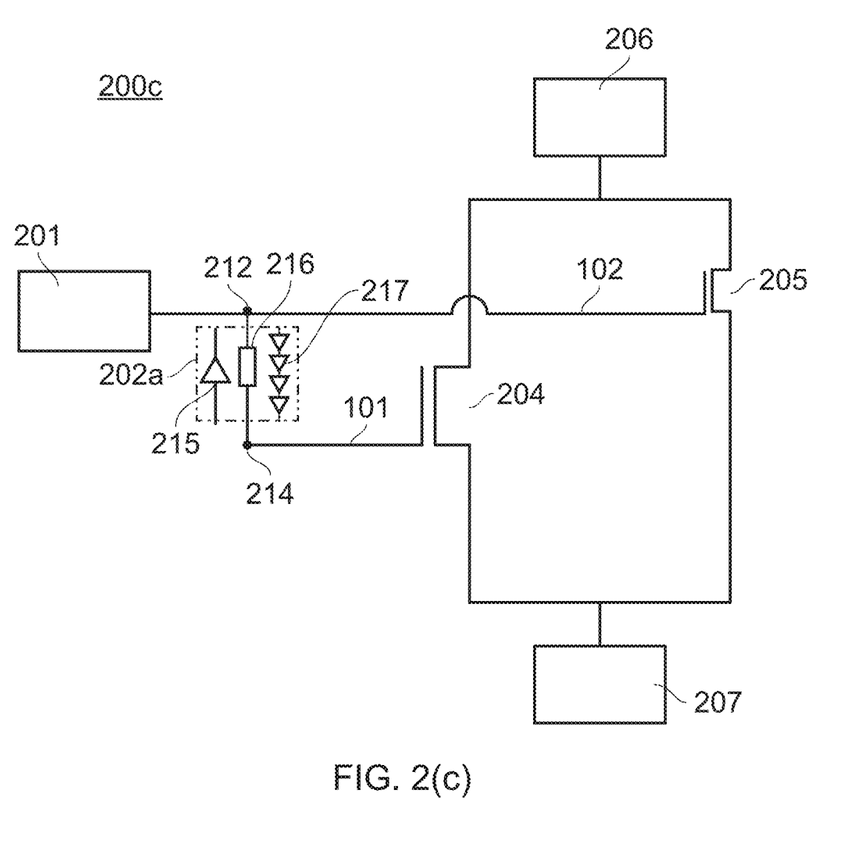

In an example as shown in FIG. 2(c), the gate control circuit 202a may comprise an anti-parallel diode 215 and parallel resistor 216 electrically coupled between nodes 212 and 214. This feature ensures that the voltage applied to low Vt gate bus-bar 101 can return to zero when the input gate voltage returns to zero. Also connected in parallel are four diodes in series 217. The diodes 217 ensure that the voltage applied to low Vt gate bus-bar is always approximately 2.8 V lower than the high Vt gate bus-bar 102. Depending on the ratings of the semiconductor device 200c, more or fewer diodes can be connected in series to adjust the desired voltage off-set.

Figure 2D:
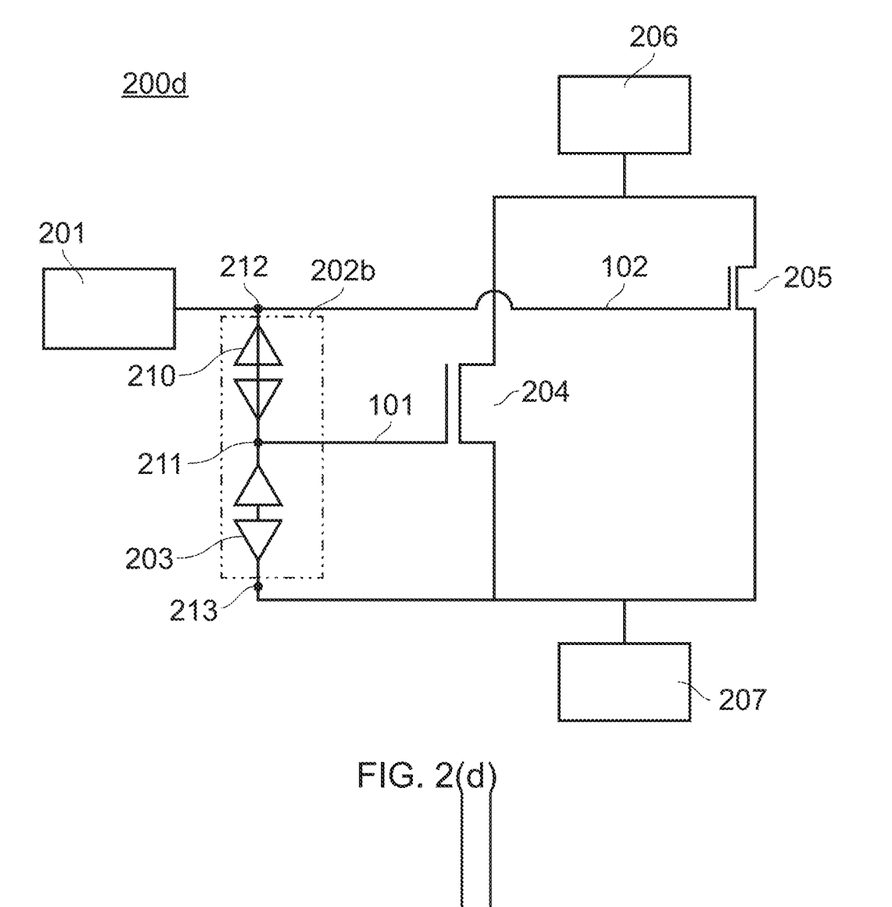

In another example as shown in FIG. 2(d), the gate control circuit may be a potential divider 202b. The upper branch 210 of the potential divider circuit 202b comprises a pair of back-to-back (anode to anode) Zener diodes connected at one end (cathode) to high Vt gate bus-bar 102 of node 212 and the other end (cathode) to low Vt gate bus-bar 101 via node 211. High Vt gate bus-bar 102 is also electrically coupled to the FET device gate terminal 201 of node 212. The lower branch 203 of the potential divider circuit 202b may comprise a pair of back-to-back Zener diodes connected between low Vt gate bus-bar 101 of node 211 and the source terminal 207 of the FET device 200d.

Figure 3:
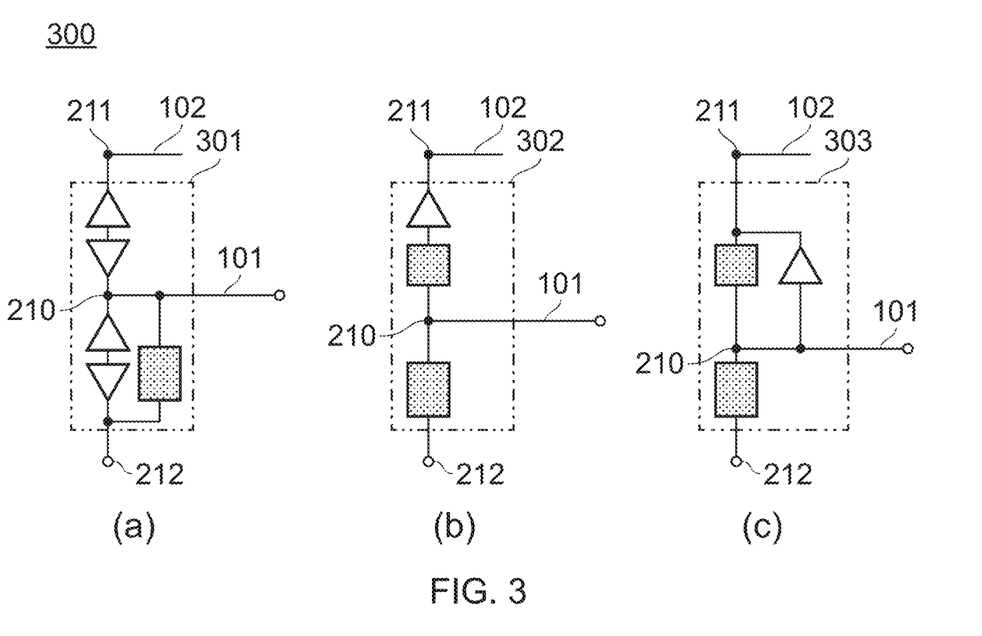
FIGS. 3(a) to 3(c) illustrate different potential divider circuit configurations suitable for use in the strip trench FET device.

According to embodiments, the configuration of the potentially divider circuit 202b is not limited to that shown in FIG. 2(d), but may be arranged in a number of different ways. The upper and lower branches 210, 203 of the potential divider circuit 202b may comprise a combination of diodes and/or resistors connected in series and/or in parallel. Non-limiting examples of suitable potential divider configurations are shown in FIGS. 3(a) to 3(c) using different potential divider circuit configurations, such as those shown in FIG. 3, alters the characteristics of the stripe trench FET device 200b, for example the turn-on and turn-off behaviour of the Vt cell gates 103, 104.

In FIG. 3(a), a variant to the potential divider 202b is shown where an additional resistor is connected in parallel to the pair of back-to-back Zener diode on the lower branch of the circuit i.e. between bus-bar 101 and the source of the FET device 307.

In another potential divider configuration shown in FIG. 3(b), a Zener diode in series with a resistor is connected between bus-bar 101 and bus-bar 102 on the upper branch between nodes 210, 211. The lower branch of the circuit between bus-bar 101 and the source of the FET 307 comprises a resistor.

In a further example, the potential divider configuration in FIG. 3(c) may be arranged such that a resistor in parallel to a Zener diode is connected in the upper branch of the circuit to bus-bars 102 and 101, between nodes 210, 211. A further resistor is connected in the lower branch between bus-bar 101 and the source 307 of the FET device.

Depending on the application and mode of operation of the FET device 200b (e.g. linear mode or resistive mode), suitably rated diodes and resistance values for the potential divider circuits in FIGS. 3(a) to (c) may be used to achieve the desired turn on and turn off effect of the low and high Vt cells. This will be discussed in the next section.

The semiconductor devices 200b and 200b may be operated in two main regions of the drain source current $I_d$, vs drain source voltage $V_{ds}$ characteristics curve, namely the resistive or ohmic region and the linear or saturation region. When operated in the resistive or ohmic region, the relationship between $V_{ds}$ and Ids follows Ohm's law in that an increase in $V_{ds}$ results in a proportional increase in Ids. When operated in the linear or saturation region however, Ids is almost independent of $V_{ds}$ for a given gate source voltage $V_{gs}$. Power dissipation in the device tends to be higher when operating in the linear region as both Ids and $V_{ds}$ tend to be simultaneously high. Many applications exist with the FET device being operated primarily in the linear region such as switching applications for example DC/DC converters and active clamp operations for example during switching of inductive loads and linear voltage regulators in automotive applications.

In order to better understand the operation of the semiconductor device, embodiments of the stripe trench FET device as shown in FIGS. 2(c) and 2(d) will be described herein, purely by way of example.

In a first example in FIG. 2(c), the gate control circuit 202a is electrically coupled to the gate terminal 201 and the low Vt gate bus-bar 101 of the FET device 200c.

Figure 4:
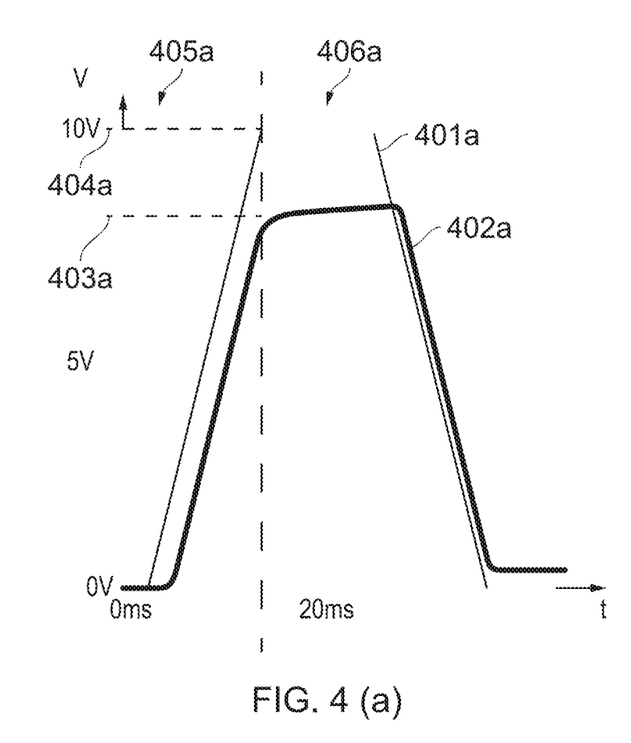
FIGS. 4(a) to 4(b) illustrate low and high Vt gate bus-bar voltage profiles in linear mode and resistive mode operation for different stripe trench FET devices.

According to embodiments, when operating the FET device 200c in the linear region, an external gate bias voltage below a fixed threshold gate voltage (for example <10 v) is applied between the gate 201 and source 207 of the FET device 200c. This may result in an input voltage applied across the gate control circuit 202a. The gate control circuit 202a provides an output voltage that is a fraction of the input voltage to the low Vt gate bus-bar 101. In this configuration, only the high Vt cells 104 of the FET device 200c turn on and conduct the load current $I_{ds}$. The low Vt cells 103 are non-operational. The high Vt cells, each having a wider load current conduction region 106, will be able to handle higher load currents without risk of the device 200c experiencing thermal runaway in linear mode operation. FIG. 4(a) illustrates the bus-bar 101 voltage 402a and the bus-bar 102 voltage 401a profiles in the linear mode 405a. In this example, in linear mode, the high Vt gate bus-bar 102 voltage 401a is approximately 10 volts (the magnitude of this voltage depends on the threshold voltage level of the Vt cells) and the low Vt gate bus-bar 101 voltage 402a is negligible.

When the FET device 200c is turned on in linear mode, the drain current flows from the drain terminal 206 to the source terminal 207 of the FET device via the high Vt cells 104 within the FET device 200c. As the high Vt cells 104 make up the minority of the voltage cells on the FET structure and are evenly distributed over the surface of the substrate, they are able to conduct high load currents (i.e. FET have high current density) while being less susceptible to thermal runaway.

When operating the FET device 200c in the resistive or ohmic region, an external gate bias voltage above the threshold gate voltage (for example >10 v) is applied across the potential divider circuit 202b of the FET device 200c, between the gate 201 and source 207 of the device. The potential divider outputs a voltage at a magnitude that is sufficient to turn on the low Vt cells 103. In this configuration, both the low Vt cells 103 as well as the high Vt cells 104 are operational and conducting current.

In a second example in FIG. 2(d), the potential divider circuit 202b is electrically coupled to the gate terminal 201 and source terminal 207 of the FET device 200d.

Figure 4B:
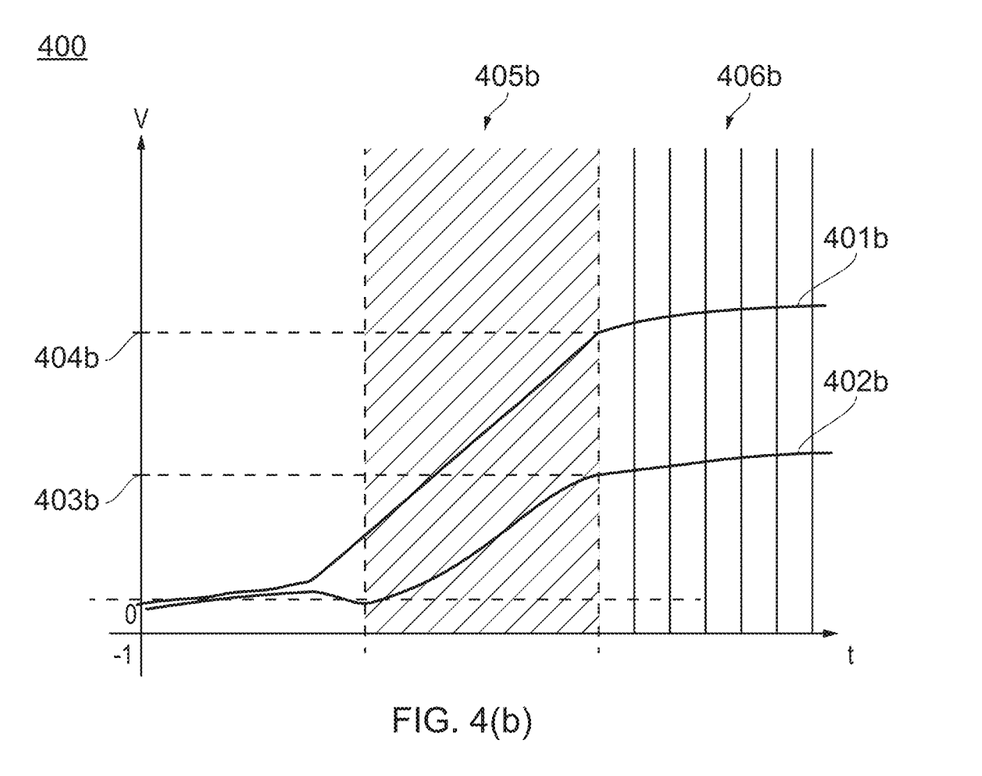

According to embodiments, when operating the FET device 200d in the linear region, an external gate bias voltage below a fixed threshold gate voltage (for example <10 v) is applied between the gate 201 and source 207 of the FET device 200d. This results in an input voltage applied across the divider circuit. The potential divider circuit provides an output voltage that is a fraction of the input voltage to the circuit. In this configuration, only the high Vt cells 104 of the FET device 200d turn on and conduct the load current $I_{ds}$. The low Vt cells 103 are non-operational. The high Vt cells, each having a wider load current conduction region 106, will be able to handle higher load currents without risk of the device 200d experiencing thermal runaway in linear mode operation. FIG. 4(b) illustrates the bus-bar 101 voltage 402b and the bus-bar 102 voltage 401b in the linear mode 405b. In this example, in linear mode, the high Vt gate bus-bar 102 voltage 401b is approximately 3 volts (the magnitude of this voltage depends on the threshold voltage level of the Vt cells) and the low Vt gate bus-bar 101 voltage 402b is negligible.

FIGS. 4(a) and 4(b) also illustrates the bus-bar 101 voltage 402a, 402b and the bus-bar 102 voltage 401a, 401b in the resistive mode 406. Advantageously, low on state resistance $R_{dson}$ can be achieved on the FET devices 200a and 200b.

Stripe trench FETs, with monolithically integrated regions of low and high threshold voltage Vt cells on the top surface of a carrier or substrate, may be achieved by creating regions of high p-doping (high Vt) and low p-doping (low Vt) or by creating regions of thick gate oxide (high Vt) and thin gate oxide (low Vt). The high vt regions are electrically coupled to a bus-bar and the low vt region are electrically coupled to a separate bus-bar.

The gate control circuit as illustrated in FIGS. 2(c) and 2(d) may then be monolithically integrated into the same substrate to alter the behaviour of the MOSFET. A poly silicon material can be doped to create diodes and resistors. A potential divider comprising a combination of Zener diodes and/or resistors connected in series and/or parallel can be doped on the poly silicon material.

In hot swap applications, hot swap controllers allow electronic circuit boards and cards to be removed and/or inserted into the backplanes of live systems, for example servers and communication systems that are required to operate continuously, without the need to power down the systems.

Hot swap controller circuits may comprise devices such as MOSFETs to control start-up inrush and fault currents that occur during the hot swapping process. During these transient events, the MOSFET may be required to dissipate power that is greater than steady-state and can well exceed the thermal limits of the MOSFET.

The semiconductor device disclosed in the foregoing is well suited for such applications, in particular, to regulate the start-up inrush and fault current. This can be achieved by carefully controlling the turn-on and turn-off of the MOSFET during the current inrush.

In automotive fan control, for example, automotive pulse-width modulation PWM fan control, FETs may be controlled by a PWM controller to regulate the output power supply to the electric motors used to drive the fans. These FETs are switched at high frequencies and are subjected to periods of high load current and voltage during device turn-on and turn-off. Equally, the semiconductor device disclosed in the foregoing is well suited for such applications.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A field effect transistor semiconductor device comprising:
    a device gate terminal;
    a device source terminal;
    a device drain terminal;
    a substrate; and
    a plurality of field effect transistor cells, each transistor cell comprising:
        a gate terminal, a source terminal and a drain terminal, wherein the plurality of transistor cells comprise at least one low threshold voltage transistor cell and at least one high threshold voltage transistor cell arranged on the substrate,
        the gate of the at least one low threshold voltage transistor cell being connected to a first electrical conductor, and
        the gate of the at least one high threshold voltage transistor cell being connected to a second electrical conductor,
    wherein the first and second conductors are electrically coupled to the gate terminal and each of the drain terminals of the high and low threshold voltage transistor cells are connected in parallel to the device drain terminal; and
    wherein the field effect transistor semiconductor device is configured and arranged to operate the at least one high threshold voltage transistor cell during linear mode operation, and to operate both the low threshold voltage transistor cell and the high threshold voltage transistor cell during resistive mode operation.

2. The field effect transistor semiconductor device of claim 1, wherein the plurality of transistor cells are connected in stripes distributed across the major surface of the substrate.

3. The field effect transistor semiconductor device of claim 2, wherein the device gate terminal is electrically coupled to a set of the lower threshold voltage transistor cells by way of a gate control circuit connected across the first electrical conductor, the second electrical conductor and the device source terminal.

4. The field effect transistor semiconductor device of claim 3, wherein the gate control circuit is connected between the second electrical conductor and the first electrical conductor, and wherein the gate control circuit comprises one or more diodes and/or resistors connected in series and/or in parallel.

5. The field effect transistor semiconductor device of claim 3, wherein the gate control circuit is a potential divider circuit comprising an upper branch between the second electrical conductor and the first electrical conductor and a lower branch between the first conductor and the device source terminal, and wherein each branch of the gate control circuit comprises one or more diodes and/or resistors connected in series and/or in parallel.

6. The field effect transistor semiconductor device of claim 1, further comprising:
a plurality of low voltage threshold transistor cells, wherein the high voltage threshold transistor cell is located between two of the low voltage threshold transistor cells on the substrate.

7. The field effect transistor semiconductor device of claim 6, wherein the number of lower threshold voltage cells to higher threshold voltage cells is of a ratio of 9:1.

8. The field effect transistor semiconductor device of claim 1, further comprising:
three or more low voltage threshold transistor cells and a plurality of high voltage threshold transistor cells on the major surface of the substrate, wherein the plurality of high voltage threshold transistor cells are located between the low voltage threshold transistor cells in an interleaved manner, and wherein two or more low voltage threshold transistor cells are between an adjacent two of the high voltage threshold transistor cells on the major surface of the substrate.

9. The field effect transistor semiconductor device of claim 8, wherein the number of low voltage threshold transistor cells between the two adjacent high voltage threshold transistor cells are the same.

10. The field effect transistor semiconductor device of claim 1, wherein the plurality of transistor cells arranged in stripes and are distributed evenly across the substrate.

11. The field effect transistor semiconductor device of claim 1, wherein the first and second electrical conductors are bus bars.

12. A method of operating a field effect transistor semiconductor device comprising:
a device gate terminal;
a device source terminal;
a device drain terminal;
a substrate; and
a plurality of field effect transistor cells, each transistor cell comprising:
a gate terminal, a source terminal and a drain terminal, wherein the plurality of transistor cells comprise at least one low threshold voltage transistor cell and at least one high threshold voltage transistor cell arranged on substrate,
the gate of the at least one low threshold voltage transistor cell being connected to a first electrical conductor, and
the gate of the at least one high threshold voltage transistor cell being connected to a second electrical conductor,
wherein the first and second conductors are electrically coupled to the device gate terminal and each of the drain terminals of the at least one high and low threshold voltage transistor cells are connected in parallel to the device drain terminal;
the method comprising:
operating the at least one high threshold voltage transistor cell when operating the field effect transistor semiconductor device in linear mode; and
operating both the low threshold voltage transistor cell and the high threshold voltage transistor cell when operating the field effect transistor semiconductor device in resistive mode.

* * * * *

UNITED STATES PATENT AND TRADEMARK OFFICE
CERTIFICATE OF CORRECTION

PATENT NO. : 10,692,972 B2
APPLICATION NO. : 16/162631
DATED : June 23, 2020
INVENTOR(S) : Adam Richard Brown et al.

Page 1 of 1

It is certified that error appears in the above-identified patent and that said Letters Patent is hereby corrected as shown below:

On the Title Page

Please add item (30) as follows:
Foreign Application Priority Data
October 31, 2017 (EP) 17199452.8

Signed and Sealed this
Twenty-eighth Day of July, 2020

Andrei Iancu
*Director of the United States Patent and Trademark Office*